United States Patent
Livingston

(10) Patent No.: US 10,645,843 B1
(45) Date of Patent: May 5, 2020

(54) SYSTEM AND METHOD FOR AIR CONDITIONING

(71) Applicant: Dell Products L.P., Round Rock, TX (US)

(72) Inventor: Paul Delightson Livingston, Tamil Nadu (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/260,891

(22) Filed: Jan. 29, 2019

(51) Int. Cl.
*H05K 7/20* (2006.01)
*G06F 1/20* (2006.01)

(52) U.S. Cl.
CPC ........... *H05K 7/20263* (2013.01); *G06F 1/20* (2013.01); *H05K 7/20145* (2013.01); *H05K 7/20172* (2013.01); *G06F 2200/201* (2013.01)

(58) Field of Classification Search
CPC .................................................. H05K 7/20263
See application file for complete search history.

(56) References Cited

U.S. PATENT DOCUMENTS

2015/0382507 A1* 12/2015 Kato ................ H05K 7/20272
165/104.31

* cited by examiner

*Primary Examiner* — Hung V Ngo
(74) *Attorney, Agent, or Firm* — Haynes and Boone, LLP

(57) ABSTRACT

Systems and methods for air conditioning include an air conditioning matrix, a cooling fluid reservoir having a plurality of holes, and a pocket configured to receive the cooling fluid reservoir. The cooling fluid reservoir is configured to deliver a cooling fluid to the air conditioning matrix. The air conditioning matrix is coupled to the pocket. The air conditioning matrix is configured to adsorb and retain the cooling fluid seeped from the plurality of holes of the cooling fluid reservoir. In some embodiments, the air conditioning system provides one or more of cooling, air filtering, and/or sound reduction for an information handling system. In some embodiments, the air conditioning matrix includes an adsorbent coolant strip matrix and a supporting material. In some embodiments, the systems and methods further include a cooling fluid collector. The cooling fluid collector is configured to collect excess cooling fluid from the air conditioning matrix.

20 Claims, 5 Drawing Sheets

SYSTEM AND METHOD FOR AIR CONDITIONING

BACKGROUND

The present disclosure relates generally to an information handling system, and more particularly to systems and methods for air conditioning an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In information handling systems, such as, network servers, network switches, and other telecommunication equipment, cooling is typically provided by air flowing through the information handling systems, usually impelled by one or more air moving devices (e.g., fans, blowers, and/or the like). In recent years, air conditioning systems for such network devices have been improved to provide more sophisticated cooling. However, these improvements are often obtained at the expense of costly equipment and routine maintenance as well as requiring a significant amount of power to provide for more heat dissipation.

Accordingly, it would be desirable to provide a low-cost electricity-free air conditioning system for the information handling systems.

SUMMARY

According to some embodiments, an air conditioning system includes an air conditioning matrix, a cooling fluid reservoir having a plurality of holes, and a pocket configured to receive the cooling fluid reservoir. The cooling fluid reservoir is configured to deliver a cooling fluid to the air conditioning matrix. The air conditioning matrix is coupled to the pocket. The air conditioning matrix is configured to adsorb and retain the cooling fluid seeped from the plurality of holes of the cooling fluid reservoir.

According to some embodiments, the air conditioning system provides one or more of cooling, air filtering, and/or sound reduction for an information handling system.

According to some embodiments, an information handling system includes a housing having one or more ingress vents, one or more electronic components disposed within the housing, a air conditioning system attached to the housing and substantially covering the one or more ingress vents, and one or more fans for drawing air through the air conditioning matrix and the one or more ingress vents. The air conditioning system includes an air conditioning matrix, a cooling fluid reservoir having a plurality of holes, and a pocket configured to receive the cooling fluid reservoir. The cooling fluid reservoir is configured to deliver a cooling fluid to the air conditioning matrix. The air conditioning matrix is coupled to the pocket. The air conditioning matrix is configured to adsorb and retain the cooling fluid seeped from the plurality of holes of the cooling fluid reservoir.

In the figures, elements having the same designations have the same or similar functions.

DETAILED DESCRIPTION

In the following description, specific details are set forth describing some embodiments consistent with the present disclosure. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

For purposes of this disclosure, an information handling system (IHS) may include any instrumentality or aggregate of instrumentalities operable to compute, calculate, determine, classify, process, transmit, receive, retrieve, originate, server, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1A:
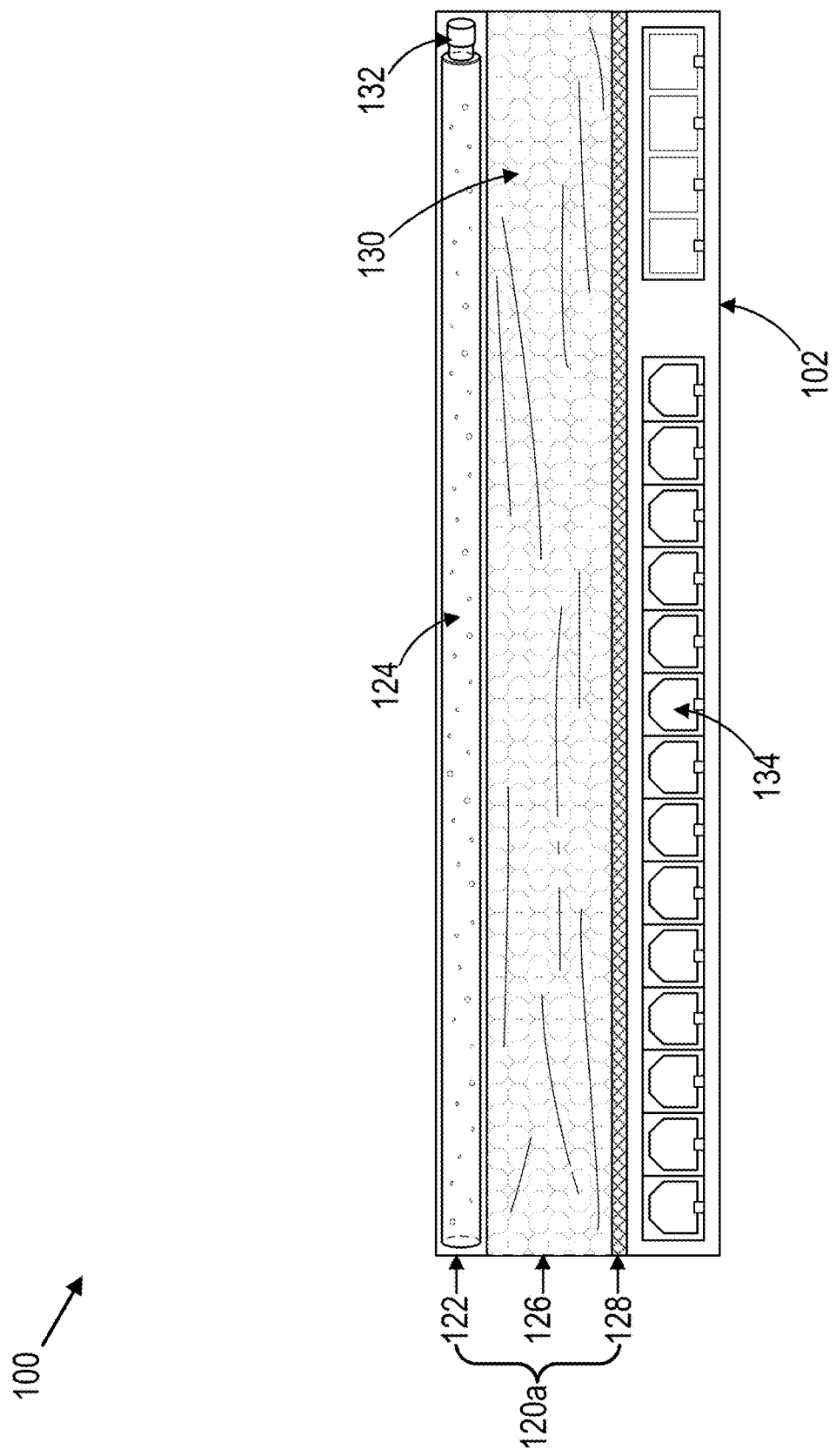
FIG. 1A is simplified diagram of a front-view of an information handling system with an air conditioning system according to some embodiments.
Figure 1B:
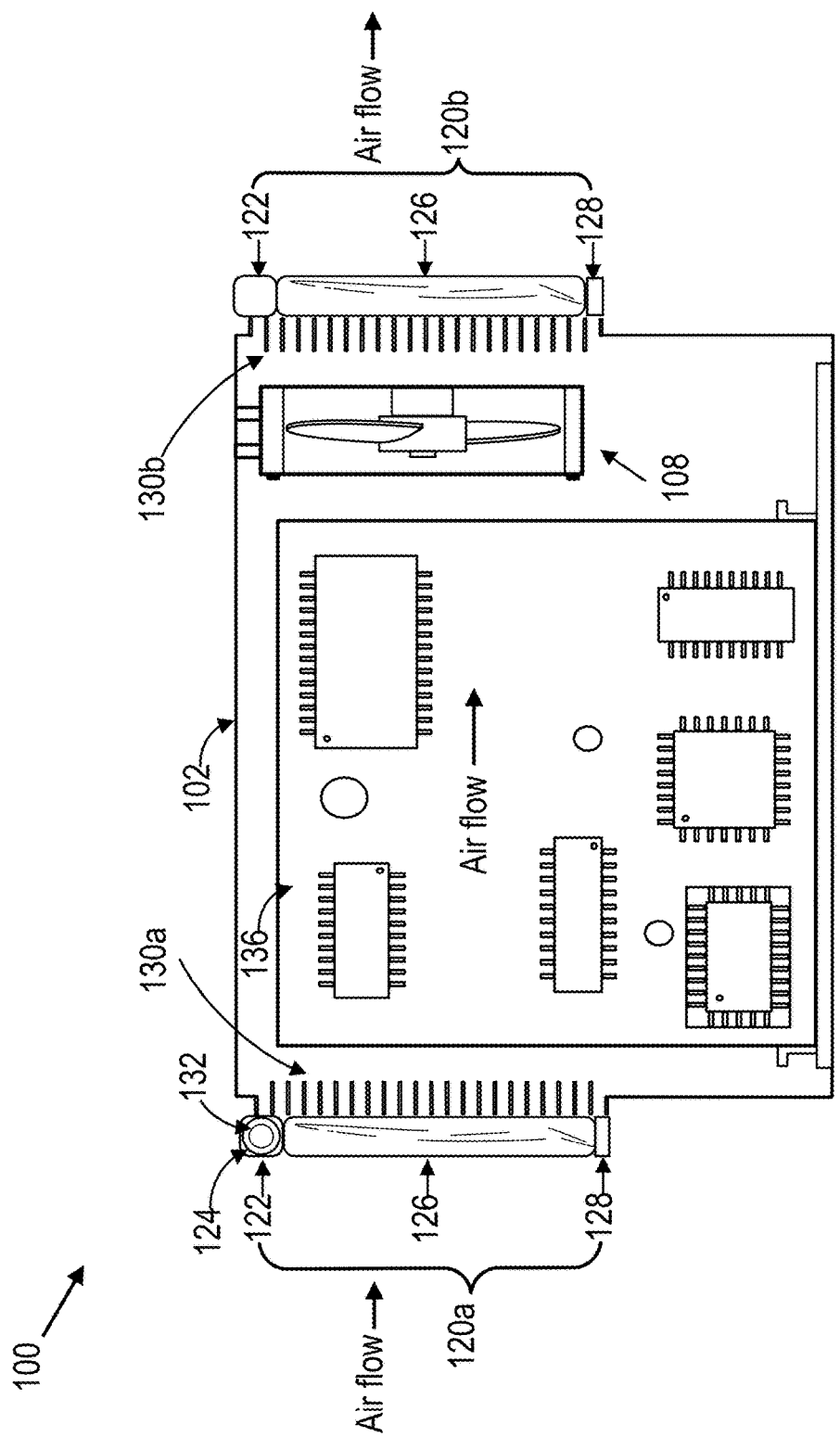
FIG. 1B is a simplified diagram of a side-view of the information handling system with the air conditioning system according to some embodiments.

FIGS. 1A and 1B are simplified front- and side-view diagrams of an information handling system 100 with an air conditioning system 120a according to some embodiments. Air conditioning system 120a may be sized based on a model, a type, and/or the like of information handling system 100. In some examples, information handling system 100 may be a computing device, a server, a router, a network switch, a telecommunication equipment, and/or the like.

As shown in FIGS. 1A and 1B, information handling system 100 includes a housing 102 with ingress vents 130a and egress vents 130b, one or more fans 108, one or more connector ports 134, and one or more circuit boards 136 with electrically coupled electronic components mounted thereto. Typically, circuit boards 136 are arranged in housing 102 between ingress vents 130a and egress vents 130b so that the outside air may be drawn into housing 102 through ingress vents 130a and the heat generated by circuit boards 136 is transferred out of housing 102 through egress vents 130b. Typically, one or more fans 108 are positioned within the housing 102 to facilitate such air flow to expedite transferring the heat out of information handling system 100 and provide cooling to circuit boards 136, as indicated by the air flow arrows in FIG. 1B.

As further shown in FIGS. 1A and 1B, information handling system 100 is equipped with ingress air conditioning system 120a. According to some embodiments, air conditioning system 120a includes an integrated pocket 122, a cooling fluid reservoir 124, an air conditioning matrix 126, and a cooling fluid collector 128. Air conditioning system 120a is attached to information handling system 100 to substantially cover ingress vents 130a to provide air conditioning such as cooling, filtering, and/or the like to the interior of information handling system 100. In some embodiments, air conditioning system 120a may further provide noise reduction to the exterior of information handling system 100.

Pocket 122 includes an opening 132 at one end that is configured to optionally receive cooling fluid reservoir 124. Consistent with some embodiments, pocket 122 is flexible enough to receive cooling fluid reservoirs 124 of different shapes and sizes. In some examples, pocket 122 may be formed from a flexible, an elastic, a semi-rigid material, and/or the like. In some examples, pocket 122 may be formed from a partially or fully transparent material to allow monitoring of cooling fluid reservoir 124 to determine whether cooling fluid reservoir 124 is ready to be refilled and/or replaced. In some examples, pocket 122 may additionally be formed from a thermally insulating, a water-resistant material, and/or the like. In some embodiments, pocket 122 may have a closure mechanism to retain cooling fluid reservoir 124 within pocket 122. The closure mechanism may include a closing structure, such as, a cap, a zipper, a velcro-based closure, a snap-based closure, a draw string, and/or the like.

Cooling fluid reservoir 124 may be used for storing a cooling fluid. Cooling fluid reservoir 124 is configured and/or sized to fit inside pocket 122. Cooling fluid reservoir 124 is configured to have a plurality of small holes to allow cooling fluid droplets to seep out of cooling fluid reservoir 124 and seep onto air conditioning matrix 126 in a controlled and calculated manner over an intended lifetime of cooling fluid reservoir 124 as described in further detail below with respect to FIG. 3. In some examples, the cooling fluid may include distilled water, ionized water and/or the like. In some examples, the cooling fluid may include a dielectric liquid (e.g., Castrol Brayco Micronic 889 and/or the like), a gel-based coolant liquid (e.g., Final Charge FXAB53 and/or the like), a mineral-oil based coolant liquid (e.g., SUNISO and/or the like), semi-synthetic chemicals (e.g., TRIM and/or the like), synthetic chemicals (e.g., Star brite 33200 and/or the like), and/or the like. In some examples, cooling fluid reservoir 124 may be formed from a material that is capable of being processed to allow holes 302 to be formed therein. In some embodiments, cooling fluid reservoir 124 may include a flexible, a semi-rigid and/or a rigid material. In some examples, cooling fluid reservoir 124 may be formed using a plastic (e.g., an acrylic plastic, a polycarbonate, a polypropylene, a nonwoven fabric and/or the like), a glass fiber, a metal, and/or the like. In some examples, cooling fluid reservoir 124 may be a plastic bag, a polybag, a pouch, and/or the like. In some embodiments, cooling fluid reservoir 124 material may be partially or fully transparent to allow monitoring of the cooling fluid through cooling fluid reservoir 124 to determine whether cooling fluid reservoir 124 is ready to be refilled and/or replaced, which is discussed in further detail below with respect to FIG. 4.

Figure 2:
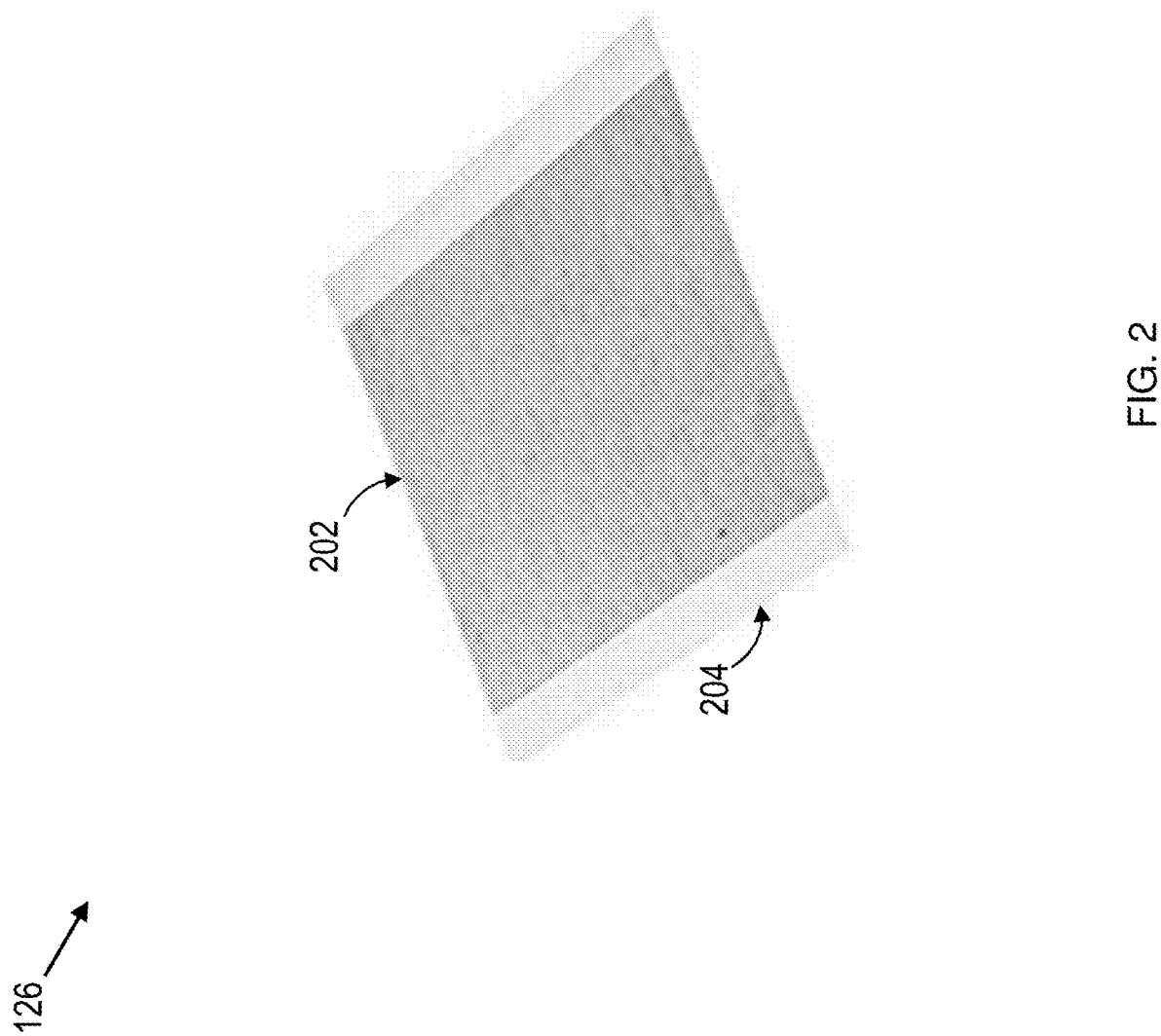
FIG. 2 is a simplified diagram of an air conditioning matrix according to some embodiments.

Air conditioning matrix 126 is located below cooling fluid reservoir 124 to receive the cooling fluid droplets that seep from cooling fluid reservoir 124. In some embodiments, air conditioning matrix 126 may be separable from, coupled to, and/or integrally connected with pocket 122. FIG. 2 is a simplified diagram of air conditioning matrix 126 according to some embodiments. Air conditioning matrix 126 may include a coolant strip matrix 202 and a supporting material 204. Coolant strip matrix 202 is used to adsorb and retain the cooling fluid droplets that seep from cooling fluid reservoir 124. Coolant strip matrix 202 may include a cooling fluid adsorbing material and/or the like. In some embodiments, coolant strip matrix 202 may be formed from a one piece or multiple small pieces of the cooling fluid adsorbing material and/or the like. In some examples, any of the pieces of coolant strip matrix 202 may be removed from supporting material 204. In some examples, the cooling fluid adsorbing material may include one or more of charcoal strips and/or sheets, a charcoal-coated material, activated charcoal, powdered wood, cotton sprinkles; adsorbent polymers, wool, and/or the like.

Supporting material 204 is used to hold coolant strip matrix 202. In some examples, supporting material 204 may be partially or fully wrapped around coolant strip matrix 202 to hold coolant strip matrix 202 in place. In some examples, supporting material 204 may be a fabric-based material and/or a textile-based material such as a cotton cloth, gauze, and/or the like. In some examples, supporting material 204 may include a polymer-based material such as a polypropylene-based material, a nonwoven fabric and/or the like.

Referring back to FIGS. 1A and 1B, cooling fluid collector 128 is located below air conditioning matrix 126 to collect any possible excess cooling fluid that may seep from the bottom of air conditioning matrix 126. Cooling fluid collector 128 is provided to prevent any excess cooling fluid from seeping and/or dripping into information handling system 100, seeping and/or dripping onto the other components of information handling system 100 (e.g., connector ports 134, and/or the like), dripping onto and/or into surrounding equipment (e.g., other information handling systems and/or the like) located below information handling system 100, dripping onto the floor and/or the like. In some embodiments, cooling fluid collector 128 may be separable from, coupled to, and/or integrally connected with air conditioning matrix 126. In some examples, cooling fluid collector 128 is an open-top reservoir (e.g., a trough, a tank, and/or the like). Cooling fluid collector 128 may include a fluid absorbing material, such as a cotton fiber-based material, a spongy material, a polyethylene-based material, a cellulose fiber-based material, a fluid absorbing foam, and/or the like. In some embodiments, when the amount of cooling fluid that is seeped onto air conditioning matrix 126 exceeds the amount of cooling fluid evaporated from air conditioning matrix 126, cooling fluid collector 128 collects the excess cooling fluid residuals allowing them to evaporate over a longer period of time. In some embodiments, the size and/or composition of cooling fluid collector 128 may be determined based on characteristics of cooling fluid reservoir 124, air conditioning matrix 126, the cooling fluid, the seepage and evaporation rates of the cooling fluid, volume and/or velocity of the air flowing through information handling system 100, ambient temperature and/or humidity of a room of information handling system 100, an interior temperature of information handling system 100, and/or the like.

Figure 3:
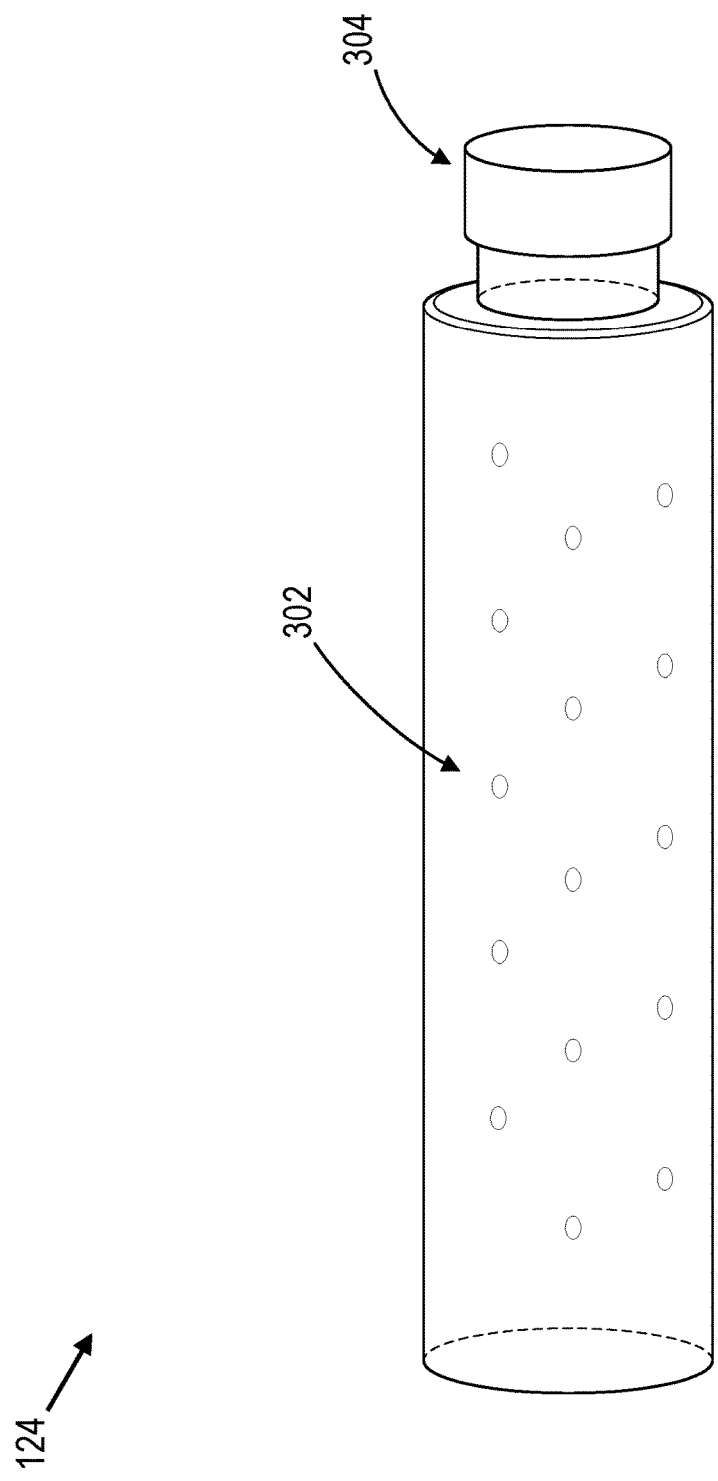
FIG. 3 is a simplified diagram of a cooling fluid reservoir according to some embodiments.

FIG. 3 is a simplified diagram of cooling fluid reservoir 124 according to some embodiments. Although cooling fluid reservoir 124 is shown in FIG. 3 with a circular cross section, other cross sections are possible including a triangle, a square, a rectangle, a regular polygon, an irregular polygon, an oval, and/or the like. According to some embodiments consistent with FIGS. 1A and 1B, cooling fluid reservoir 124 includes a plurality of small holes 302 to allow a cooling fluid to seep from cooling fluid reservoir 124 and seep onto air conditioning matrix 126 in a controlled and calculated manner as described in detail herein. In some examples, each of the holes 302 may have a same and/or a different diameter. In some examples, each of the holes 302 may have a cross-sectional area up to a range from 10 to 1000 nanometers squared. Although in FIG. 3, each of the holes 302 is shown with a circular shape, other shapes such as a square, rectangle, triangle, oval, pentagon, hexagon, irregular shapes, and/or the like are possible. In some examples, holes 302 may have different and/or same shapes. In some examples, holes 302 may have a random or organized pattern. In some examples, the distance between centers of two closest holes from the holes 302 may be calculated based on the characteristics of the cooling fluid reservoir 124, such as, an area, a circumference, a length, a cross-sectional shape, a cross-sectional thickness, a material, and/or the like. In some examples, the maximum range of distance between centers of two closest holes from the holes 302 may be calculated based on the cooling needs of information handling system 100, the amount of cooling fluid that is expected to seep out from holes 302, a minimum range number of holes 302 to provide a required cooling fluid seepage out of holes 302 without causing excess cooling fluid seepage out of holes 302, and/or the like. In some examples, depending on a shape of cooling fluid reservoir 124, holes 302 may be spread out over an entire outer surface of the cooling fluid reservoir 124 and/or on only a portion of the outer surface of cooling fluid reservoir 124. In some examples, holes 302 may be disposed along an entire axial length of cooling fluid reservoir 124.

According to some embodiments, sizes and/or a quantity of the holes 302 may be based on an amount of cooling fluid that is desired to seep onto air conditioning matrix 126 so that a sufficient cooling is obtained over an expected lifetime of cooling fluid reservoir 124 before cooling fluid reservoir 124 has to be replaced and/or refilled. In some examples, the amount of cooling fluid that is desired to seep onto air conditioning matrix 126 may be calculated to avoid excess cooling fluid residuals accumulating in cooling fluid collector 128 when the cooling fluid does not evaporate as fast as expected as discussed in further detail below with respect to Eqn. 2.

In some embodiments, cooling fluid reservoir 124 may include a closure mechanism 304 to provide an opening for receiving the cooling fluid. In some examples, the cooling fluid may be injected into cooling fluid reservoir 124, such as by using a syringe and/or the like. In some examples, closure mechanism 304 may include a manual closing component that may be closed by applying forces thereto, such as a twist cap cover, a screw cap cover, a valve, and/or the like. In some examples, closure mechanism 304 may include a self-closing component to be closed automatically, such as slap-on cap, a self-sealing valve, and/or the like.

Referring back to FIGS. 1A and 1B, air conditioning system 120a may reduce the temperature of the interior of information handling system 100. According to some embodiments, when cooling fluid reservoir 124, filled with a cooling fluid, is placed inside pocket 122, the cooling fluid droplets seep through holes 302 of cooling fluid reservoir 124 and onto air conditioning matrix 126. Subsequently, air conditioning matrix 126 adsorbs and retains the cooling fluid droplets. According to some embodiments, during operation of information handling system 100, fans 108 operate to draw surrounding air from outside information handling system 100 through air conditioning matrix 126 of air conditioning system 120a and ingress vents 130a, as indicated by air flow arrows in FIG. 1B. The cooling fluid droplets that are adsorbed by air conditioning matrix 126 are exposed to the flowing air. The cooling fluid droplets are evaporated into the flowing air thereby reducing the temperature of the flowing air. The cooled air then passes through ingress vents 130a, as indicated by the air flow arrows in FIG. 1B and flows past the internal components (e.g., circuit boards 136 and/or the like) of information handling system 100. The cooled air helps reduce the interior temperature of information handling system 100, which in turn helps cool the internal components of information handling system 100. The air then is drawn out of information handling system 100 through egress vents 130b by fans 108, as indicated by the air flow arrows in FIG. 1B, thereby removing heat from the interior of information handling system 100 and reducing the interior temperature of information handling system 100.

According to some embodiments, the initial amount of cooling fluid to add or insert into cooling fluid reservoir 124 and the amount of cooling fluid seepage over a duration of time may be limited to avoid the collection of excess cooling fluid in cooling fluid collector 128. According to some embodiments, the initial amount of cooling fluid to include in cooling fluid reservoir 124 and the amount of cooling fluid seepage over a duration of time may be calculated based on the cooling needs of information handling system 100, an intended duration of using cooling fluid reservoir 124 before refilling and/or replacing cooling fluid reservoir 124, the cooling fluid characteristics such as a fluid viscosity, a fluid volatility, and/or the like, the material's characteristics of air conditioning matrix 126 such as a dry weight, a dry basis moisture content, and/or the like.

In some embodiments, the dry basis moisture content of air conditioning matrix 126 material may be calculated when a small sample is carefully weighed and then the sample is dried by the application of heat thereto and re-weighed after drying. Any difference in weights is indicative of the dry basis moisture content of air conditioning matrix 126. The dry basis moisture content of air conditioning matrix 126 material may be represented by a percentage of a ratio of a weight of cooling fluid seeped onto air conditioning matrix 126 to a weight of dry air conditioning matrix 126 as shown in Eqn. 1.

$$\frac{\text{Dry basis}}{\text{moisture content}} = \frac{\text{Weight of added fluid}}{\text{Weight of absorbing component}} \times 100 \qquad \text{Eqn. 1}$$

In some embodiments, the amount of cooling fluid seepage over a duration of time may be calculated by multiplying the dry basis moisture content of air conditioning matrix 126 with the dry weight of air conditioning matrix 126. For example, for air conditioning matrix 126 with a dry basis moisture content of 1% per day and a dry weight of 50 grams, an amount of the cooling fluid seepage per day may be calculated according to Eqn. 2.

$$\text{Amount of the seeped cooling fluid} = 1\% \times 50 \text{ gr} \qquad \text{Eqn. 2}$$
$$= 0.5 \text{ gr}$$

Consequently, cooling fluid reservoir 124 may be configured to have holes 302 with cross-sectional areas to allow 0.5 grams of cooling fluid seepage per day.

In some embodiments, the initial amount of the cooling fluid to be inserted into cooling fluid reservoir 124 to last an intended lifetime duration of using cooling fluid reservoir 124 may be calculated by adding the required amount of cooling fluid seepage over the intended lifetime duration of using cooling fluid reservoir 124 with the dry weight of air conditioning matrix 126 and collective weights of other components of air conditioning system 120a. For example, the initial amount of the cooling fluid to be inserted into cooling fluid reservoir 124 to last the intended lifetime duration of using cooling fluid reservoir 124 (e.g., 12 months) may be calculated according to Eqn. 3.

Initial amount of cooling fluid=(0.5 gr×365)+50 gr+~10 gr=~242.5 gr    Eqn. 3 where the 10 grams is an estimation of collective weights of other components of air conditioning system 120a. In some examples, in a room temperature, air conditioning system 120a attached to information handling system 100, and substantially covering ingress vents 130a, may provide up to a 3 to 5 degrees temperature reduction to the interior of information handling system 100.

In some embodiments, air conditioning system 120a may further provide air filtering as air dust particles are blocked from passing through air conditioning matrix 126. In some embodiments, air conditioning system 120a may further provide noise reduction as air conditioning matrix 126 blocks and/or reflects sound waves generated by internal components of information handling system 100. In some examples, air conditioning system 120a attached to information handling system 100 may provide up to a 3 to 5 dB noise reduction to the exterior to information handling system 100.

In some embodiments, air conditioning system 120a is attached to information handling system 100 with one or more of an adhesive material, a fastener structure, a supporting structure, and/or the like. In some examples, the adhesive material may include one or more of an adhesive strip, double-sided tape, and/or the like. In some examples, the fastener structure may include a velcro-based structure, a hook and loop pad, a snap, and/or the like. In some examples, the supporting structure may include a snap support tab, a mounting hook, a clamp, snap-in plunger, a sheet metal screw, friction fit, a friction ring, a magnetic strip, a quick release clamp, and/or the like.

In some embodiments, air conditioning system 120a may be attached to information handling system 100 at a time of manufacturing and/or attached separately. In some examples, air conditioning system 120a may be re-attachable and/or replaceable. In some embodiments, air conditioning system 120a may be replaced depending on changes in the cooling needs of information handling system 100, the room conditions, such as, a room temperature, a room humidity, and/or the like, the air flow volume, velocity, and/or the like. In some embodiments, one or more components of air conditioning system 120a may be replaced depending on changes in the cooling needs of information handling system 100, the room conditions, such as, a room temperature, a room humidity, and/or the like, the air flow volume, velocity, and/or the like. In some examples, as the cooling needs of information handling system 100 change, cooling fluid reservoir 124 may be replaced with a cooling fluid reservoir 124 with more and/or fewer holes 302, smaller and/or larger holes 302, a smaller and/or larger fluid capacity, and/or the like.

Referring back to FIG. 1B, information handling system 100 is also shown with an optional egress air conditioning system 120b that is substantially similar to air conditioning system 120a but does not include cooling fluid reservoir 124. Air conditioning system 120b is attached to information handling system 100 to substantially cover egress vents 130b to provide air filtering to the out-flow air as air dust particles are blocked from passing through air conditioning matrix 126 of air conditioning system 120b. In some examples, air conditioning system 120b may further provide noise reduction by blocking and/or reflecting sound waves generated by internal components from propagating outside of information handling system 100. Air conditioning system 120b may be configured to provide cooling to the out-flow air as well if a cooling fluid reservoir such as cooling fluid reservoir 124 filled with a cooling fluid is also inserted into pocket 122 of air conditioning system 120b.

Figure 4:
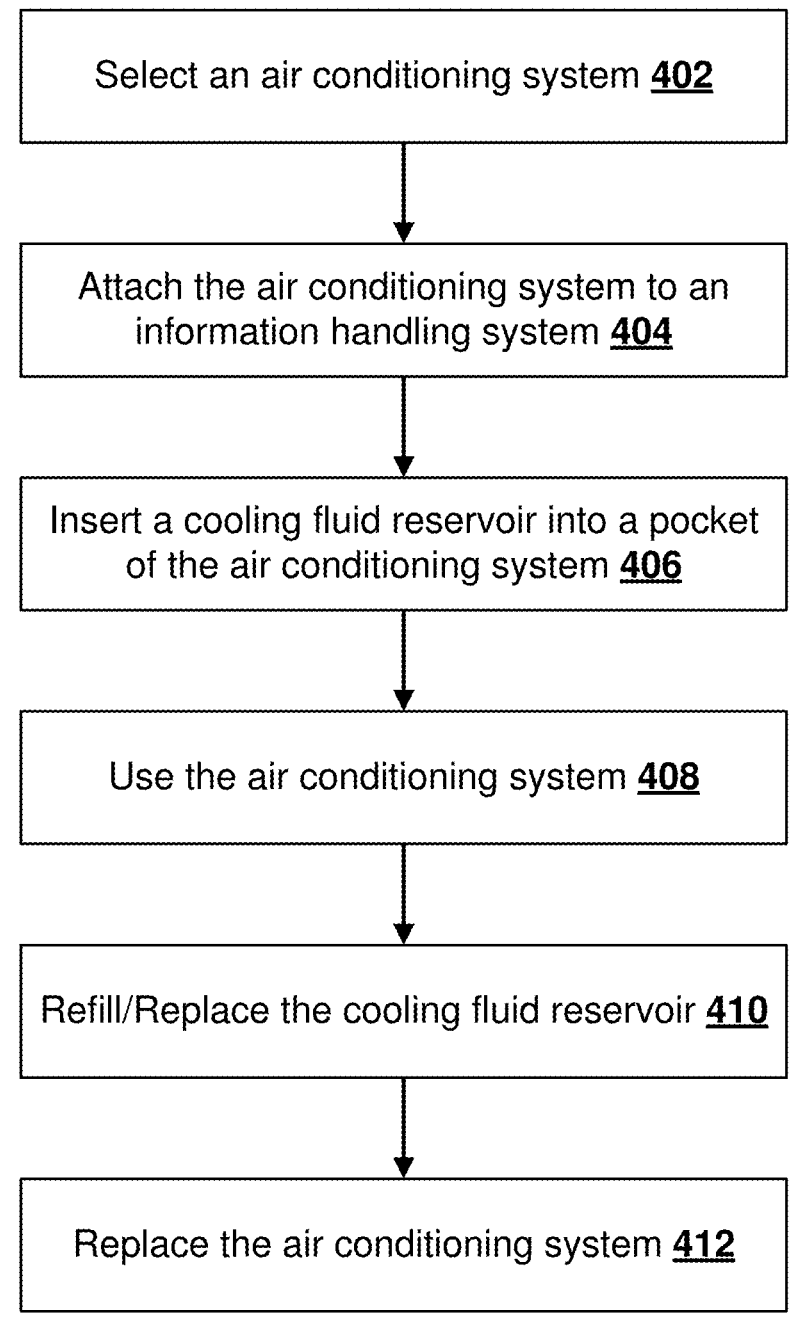
FIG. 4 is a simplified diagram of a method of using an air conditioning system according to some embodiments.

FIG. 4 is a simplified diagram of a method 400 for air conditioning an information handling system according to some embodiments. In some embodiments, the air conditioning includes one or more of air cooling, air filtering, and/or noise reduction.

At a block 402, an air conditioning system is selected. In some examples, the air conditioning system may be consistent with air conditioning system 120a. In some examples, the air conditioning system is selected based on one or more of cooling needs, a size, a model, and/or the like of the information handling system. In some embodiments, the air conditioning system is selected to fit the size of the information handling system to substantially cover the ingress vents (e.g., ingress vents 130a) of the information handling system (e.g., information handling system 100). In some embodiments, selecting the air conditioning system may further depend on an intended lifetime duration of using a cooling fluid reservoir of the air conditioning system (e.g., 1 year).

At a block 404, the selected air conditioning system is attached to the information handling system. The air conditioning system is attached so as to substantially cover the ingress vents of the information handling system. In some embodiments, the air conditioning system may be attached to the information handling system at a time of manufacturing and/or attached separately. In some examples, the air conditioning system may be separately attached at the time of manufacturing and/or any time after manufacturing such as, for example, before and/or after the information handling system is in use in a data center. In some examples, the air conditioning system may be attached to the information handling system with one or more of an adhesive material, a fastener structure, a supporting structure, and/or the like.

At a block 406, a cooling fluid reservoir is inserted into a pocket of the air conditioning system. In some examples, the cooling fluid reservoir is consistent with cooling fluid reservoir 124 and the pocket is consistent with pocket 122. In some embodiments, the cooling fluid reservoir may be pre-filled with a cooling fluid. In some examples, the cooling fluid may include distilled water, ionized water, a dielectric liquid (e.g., Castrol Brayco Micronic 889 and/or the like), a gel-based coolant liquid (e.g., Final Charge FXAB53 and/or the like), a mineral-oil based coolant liquid (e.g., SUNISO and/or the like), semi-synthetic chemicals (e.g., TRIM and/or the like), synthetic chemicals (e.g., Star brite 33200 and/or the like), and/or the like. In some examples, the pre-filled cooling fluid reservoir may include a sealing cover such as a shrink wrap coating and/or the like to prevent seepage of the cooling fluid from the holes (e.g., holes 302) of the cooling fluid reservoir before use in the air conditioning system. In some embodiments, the cooling fluid reservoir may be filled with a cooling fluid after the cooling fluid reservoir is inserted into the pocket. In some examples, the cooling fluid may be inserted into the cooling fluid reservoir by opening a closure mechanism (e.g., closure mechanism 304) of the cooling fluid reservoir and injecting the cooling fluid into the cooling fluid reservoir, such as by using a syringe and/or the like. In some examples, an amount of the cooling fluid to inserted into to the cooling fluid reservoir may be calculated to last an intended lifetime duration of using the cooling fluid reservoir of the air conditioning system (e.g., 1 year), such as is described above.

At a block 408, the air conditioning system is used to cool and/or filter the air flowing through the information handling system. In some examples, the air conditioning system may also reduce noise generated by the internal components of the information handling system. In some examples, the air conditioning of the information handling system may continue for all or part of an intended lifetime of the cooling fluid reservoir of the air conditioning system (e.g., 1 year). In some examples, the air conditioning system may be scheduled for periodic monitoring (e.g., every week) based on the intended lifetime of the cooling fluid reservoir of the air conditioning system.

At a block 410, the cooling fluid reservoir is replaced and/or refilled. The air conditioning system may be monitored periodically (e.g., every week) based on the intended lifetime of the cooling fluid reservoir of the air conditioning system to determine if the cooling fluid reservoir is ready to be replaced and/or refilled. In some embodiments, when the pocket and/or the cooling fluid reservoir are partially or fully transparent, the cooling fluid reservoir and/or the cooling fluid may be monitored through the pocket and/or cooling fluid reservoir. In some embodiments, the cooling fluid reservoir may be refilled and/or replaced when the cooling fluid reservoir is empty. In some embodiments, the cooling fluid reservoir may be replaced if the cooling fluid reservoir becomes unusable, ineffective, and/or the like, such as, for example, when the cooling fluid reservoir is broken, cracked, torn, dirty, and/or the like. In some examples, the cooling fluid reservoir may be replaced with a cooling fluid reservoir that is prefilled with a cooling fluid such as any cooling fluid discussed above. In some examples, the cooling fluid reservoir may be refilled with a cooling fluid such as any cooling fluid discussed above. In some embodiments, the cooling fluid reservoir may be refilled and/or replaced as the cooling needs of the information handling system change. In some examples, when the room temperature increases, the cooling needs of the information handling system increases. Thereby, the cooling fluid reservoir may be replaced with a cooling fluid reservoir with more, and/or larger holes, and/or larger fluid capacity, and/or the like.

At a block 412, the air conditioning system is replaced. In some embodiments, air conditioning system may be replaced depending on changes in the cooling needs of the information handling system, the room conditions of the information handling system, such as, the room temperature, the room humidity, and/or the like, the air flow volume, velocity, and/or the like. In some examples, the air conditioning system may be replaced if the air conditioning system is not properly attached to the information handling system. In some examples, the air conditioning system may be replaced if one or more components of the air conditioning system (e.g. cooling fluid reservoir 124, air conditioning matrix 126, and cooling fluid collector 128) become usable and/or ineffective, such as, for example, when the one or more components of the air conditioning system is broken, cracked, torn, dirty, and/or the like.

As discussed above and further emphasized here, FIG. 4 is merely an example which should not unduly limit the scope of the claims. One of ordinary skill in the art would recognize many variations, alternatives, and modifications. In some embodiments, a second air conditioning system may additionally be selected for the information handling system. In some examples, the second air conditioning system may be consistent with air conditioning system 120b. In some examples, the second air conditioning system is selected based on one or more of cooling needs, a size, a model, and/or the like of the information handling system. In some embodiments, the second air conditioning system is selected to fit the size of the information handling system to substantially cover the egress vents (e.g., egress vents 130b) of the information handling system (e.g., information handling system 100). In some embodiments, selecting the second air conditioning system may further depend on an intended lifetime duration of using the cooling fluid reservoir of the second air conditioning system (e.g., 1 year). In some embodiments, a cooling fluid reservoir may be omitted from the second air conditioning system.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:
1. An air conditioning system comprising:
   an air conditioning matrix;
   a cooling fluid reservoir having a plurality of holes, the cooling fluid reservoir being configured to deliver a cooling fluid to the air conditioning matrix; and
   a pocket configured to receive the cooling fluid reservoir;
   wherein:
      the air conditioning matrix is coupled to the pocket; and the air conditioning matrix is configured to adsorb and retain the cooling fluid seeped from the plurality of holes of the cooling fluid reservoir.

2. The air conditioning system in claim 1, further comprising:
a cooling fluid collector open on one side, the cooling fluid collector being coupled to the air conditioning matrix and being configured to collect excess cooling fluid from the air conditioning matrix,
wherein the cooling fluid collector includes a cotton fiber-based material, a spongy material, a polyethylene-based material, a cellulose fiber-based material, or a fluid absorbing foam.

3. The air conditioning system in claim 1, wherein the air conditioning system is configured to be attached to an information handling system, substantially covering ingress vents of the information handling system.

4. The air conditioning system in claim 1, wherein an amount of the cooling fluid and sizes of the pocket, the cooling fluid reservoir, or the air conditioning matrix depend on cooling needs of an information handling system and an intended lifetime of the cooling fluid reservoir.

5. The air conditioning system in claim 1, wherein the cooling fluid includes one or more of distilled water, ionized water, a dielectric liquid, a gel-based coolant liquid, or a mineral-oil based coolant liquid.

6. The air conditioning system in claim 1, wherein the cooling fluid reservoir includes a self-closing closure mechanism.

7. The air conditioning system in claim 1, wherein the cooling fluid reservoir and the pocket are transparent.

8. The air conditioning system in claim 1, wherein the cooling fluid reservoir has a circular, a triangle, a square, a rectangle, a regular polygon, an irregular polygon, or an oval cross section.

9. The air conditioning system in claim 1, wherein the plurality of holes has an organized pattern.

10. The air conditioning system in claim 1, wherein each of the plurality of holes have a cross-sectional area up to a range from 10 to 1000 nanometers squared.

11. The air conditioning system in claim 10, wherein the cross-sectional area of each of the plurality of holes or a quantity of the plurality of holes depend on cooling needs of an information handling system or an intended lifetime of the cooling fluid reservoir.

12. The air conditioning system in claim 1, wherein the air conditioning matrix comprises:
a coolant strip matrix configured to adsorb the cooling fluid; and
a supporting material configured to hold the coolant strip matrix,
wherein:
the coolant strip matrix includes activated charcoal, a charcoal-coated material, charcoal strips, charcoal sheets, powdered wood, cotton sprinkles, adsorbent polymers, or wool, and
the supporting material includes cotton cloth, cotton gauze, a polypropylene-based material, or a nonwoven fabric.

13. An information handling system comprising:
a housing having one or more ingress vents;
one or more electronic components disposed within the housing;
a first air conditioning system attached to the housing and substantially covering the one or more ingress vents, the first air conditioning system comprising:

an air conditioning matrix;
a cooling fluid reservoir having a plurality of holes, the cooling fluid reservoir being configured to deliver a cooling fluid to the air conditioning matrix; and
a pocket configured to receive the cooling fluid reservoir;
wherein:
the air conditioning matrix is coupled to the pocket; and
the air conditioning matrix is configured to adsorb and retain the cooling fluid seeped from the plurality of holes of the cooling fluid reservoir; and
one or more fans for drawing air through the air conditioning matrix and the one or more ingress vents.

14. The information handling system of claim 13, wherein the first air conditioning system further comprises:
a cooling fluid collector, open on one side, the cooling fluid collector being coupled to the air conditioning matrix and being configured to collect excess cooling fluid from the air conditioning matrix,
wherein the cooling fluid collector includes a cotton fiber-based material, a spongy material, a polyethylene-based material, a cellulose fiber-based material, or a fluid absorbing foam.

15. The information handling system of claim 13, wherein:
the housing further includes one or more egress vents; and
the information handling system further comprises:
a second air conditioning system attached to the housing and substantially covering the one or more egress vents, the second air conditioning system comprising:
a second air conditioning matrix; and
a second pocket coupled to the second air conditioning matrix.

16. The information handling system of claim 13, wherein an amount of the cooling fluid and sizes of the pocket, the cooling fluid reservoir, or the air conditioning matrix depend on cooling needs of the information handling system and an intended lifetime of the cooling fluid reservoir.

17. The information handling system of claim 13, wherein the cooling fluid reservoir and the pocket are transparent.

18. The information handling system of claim 13, wherein the cooling fluid reservoir has a circular, a triangle, a square, a rectangle, a regular polygon, an irregular polygon, or an oval cross section.

19. The information handling system of claim 13, wherein a cross-sectional area of each of the plurality of holes or a quantity of the plurality of holes depend on cooling needs of an information handling system or an intended lifetime of the cooling fluid reservoir.

20. The information handling system of claim 13, wherein the air conditioning matrix comprises:
a coolant strip matrix configured to adsorb the cooling fluid; and
a supporting material configured to hold the coolant strip matrix,
wherein:
the coolant strip matrix includes activated charcoal, a charcoal-coated material, charcoal strips, charcoal sheets, powdered wood, cotton sprinkles, adsorbent polymers, or wool, and
the supporting material includes cotton cloth, cotton gauze, a polypropylene-based material, or a nonwoven fabric.

* * * * *